(12) United States Patent
Thundat et al.

(10) Patent No.: US 8,378,286 B2
(45) Date of Patent: Feb. 19, 2013

(54) ACOUSTIC ENHANCEMENT FOR PHOTO DETECTING DEVICES

(75) Inventors: Thomas G. Thundat, Knoxville, TN (US); Lawrence R. Senesac, Knoxville, TN (US); Charles W. Van Neste, Kingston, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 371 days.

(21) Appl. No.: 12/837,703

(22) Filed: Jul. 16, 2010

(65) Prior Publication Data
US 2012/0012737 A1 Jan. 19, 2012

(51) Int. Cl.
*H01J 40/14* (2006.01)
(52) U.S. Cl. ............... 250/214 R; 250/206; 333/133; 310/311
(58) Field of Classification Search ......... 250/214 R, 250/214 C, 206; 333/133, 187, 193; 310/311, 310/313 R, 320
See application file for complete search history.

(56) References Cited

U.S. PATENT DOCUMENTS

| | | | |
|---|---|---|---|
| 5,348,002 A | 9/1994 | Caro | |
| 6,880,402 B1 * | 4/2005 | Couet et al. | ............ 73/579 |
| 2008/0030714 A1 | 2/2008 | Hall et al. | |
| 2011/0260988 A1 * | 10/2011 | Colgate et al. | ........ 345/173 |

FOREIGN PATENT DOCUMENTS

| | | |
|---|---|---|
| WO | 0042721 | 7/2000 |
| WO | 2006064211 A1 | 6/2006 |
| WO | 2009109897 A1 | 9/2009 |

OTHER PUBLICATIONS

C.W. Van Neste, et al., "Standoff Spectroscopy of Surface Absorbed Chemicals," Anal. Chem., 2009, pp. 1952-1956, vol. 81, Issue 5.

* cited by examiner

*Primary Examiner* — Kevin Pyo
(74) *Attorney, Agent, or Firm* — Colin L. Cini

(57) ABSTRACT

Provided are improvements to photo detecting devices and methods for enhancing the sensitivity of photo detecting devices. A photo detecting device generates an electronic signal in response to a received light pulse. An electro-mechanical acoustic resonator, electrically coupled to the photo detecting device, damps the electronic signal and increases the signal noise ratio (SNR) of the electronic signal. Increased photo detector standoff distances and sensitivities will result.

20 Claims, 5 Drawing Sheets

ACOUSTIC ENHANCEMENT FOR PHOTO DETECTING DEVICES

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

BACKGROUND OF THE INVENTION

1. Field of the Invention

The present disclosure relates to photo detecting devices, and more specifically to improvements for providing enhanced sensitivity to photo detecting devices and methods of enhancing the sensitivity of photo detecting devices.

2. Description of the Related Art

Photo detecting devices are found in everything from television remote controls to advanced weapon guidance systems. Photo detecting devices are generally defined as any radiant electromagnetic detecting apparatus. Examples may include photoresistors, photovoltaics, photodiodes, etc.

Electromagnetic radiation is classified by wavelength into radio, microwave, infrared, ultraviolet, X-rays and gamma rays. When light waves strike materials within certain photo detecting devices, a voltage and current are generated, or a change in electrical resistance will occur. As long as the light is present, the electrical voltage and current will modulate; and it stops when the light is removed. Any of the above conditions may be used to change the flow of electrical current or voltage in an external circuit and thus may be used to monitor the presence of the light and to measure the light's intensity.

The wavelength response of a photo detecting device shows a long-wavelength cutoff. If the wavelength is longer than the cutoff wavelength, the light energy is too small to produce a free electron and the response of the photo detector drops to zero. Photo detection device sensitivity to light pulses is generally developed during device fabrication, and there exists little means to improve sensitivity after fabrication. In some instances, electronic instrumentation is used to lower photo detecting device output noise. However, these instruments have low quality factors that reduce their ability to detect very low signals.

An electro-mechanical acoustic resonator is a mechanical device that will resonate when excited by a voltage in an electrical circuit. Some examples of electro-mechanical acoustic resonators include quartz crystal tuning forks, quartz crystal microbalances, microcantilevers and piezoelectric actuators. Quartz crystal tuning forks are typically used to keep extremely accurate time in quartz watches. The piezoelectric properties of quartz cause the quartz tuning fork to generate a pulsed electrical current as it resonates. Quartz crystal microbalances measure the change in frequency of a quartz crystal resonator and can be used to dampen oscillations. Microcantilevers work by measuring the change in deflection or vibrational frequency of the microcantilever. Piezoelectric actuators are transducers that convert electrical energy into a mechanical displacement or stress. The Piezoelectric effect is reversible, so an applied stress is capable of producing electrical energy in proportion to the stress on the material. The piezoelectric effect typically occurs in non conductive materials such as crystals and quartz.

BRIEF SUMMARY OF THE INVENTION

Provided are improvements to photo detecting devices for enhanced sensitivity and methods for enhancing the sensitivity of photo detecting devices.

An electro-mechanical acoustic resonator is electronically coupled to a photo detecting device and an electronic signal with improved signal to noise ratio results. The photo detecting device produces a first electronic signal in response to a received light pulse, and the first electronic signal is received by the electro-mechanical acoustic resonator. The electro-mechanical acoustic resonator damps the electronic signal so that it has a signal to noise ratio (SNR) that is greater than the signal to noise ratio (SNR) of the first electronic signal.

A method of enhancing the sensitivity of a photo detecting device includes the steps of; receiving a light pulse having a pulse rate with the photo detecting device; generating a first electronic signal with the photo detecting device in response to the received light pulse; damping the first electronic signal with a electro-mechanical acoustic resonator that is electronically coupled to the photo detecting device; and generating a damped electronic signal with the electro-mechanical acoustic resonator so that the damped electronic signal has a signal to noise ratio (SNR) that is greater than the signal to noise ratio (SNR) of the first electronic signal.

BRIEF DESCRIPTION OF THE SEVERAL VIEWS OF THE DRAWINGS

A more complete understanding of the preferred embodiments will be more readily understood with reference to the following detailed description when considered in conjunction with the accompanying drawings wherein like numerals indicate common elements among the various figures.

DETAILED DESCRIPTION OF THE INVENTION

Figure 1:
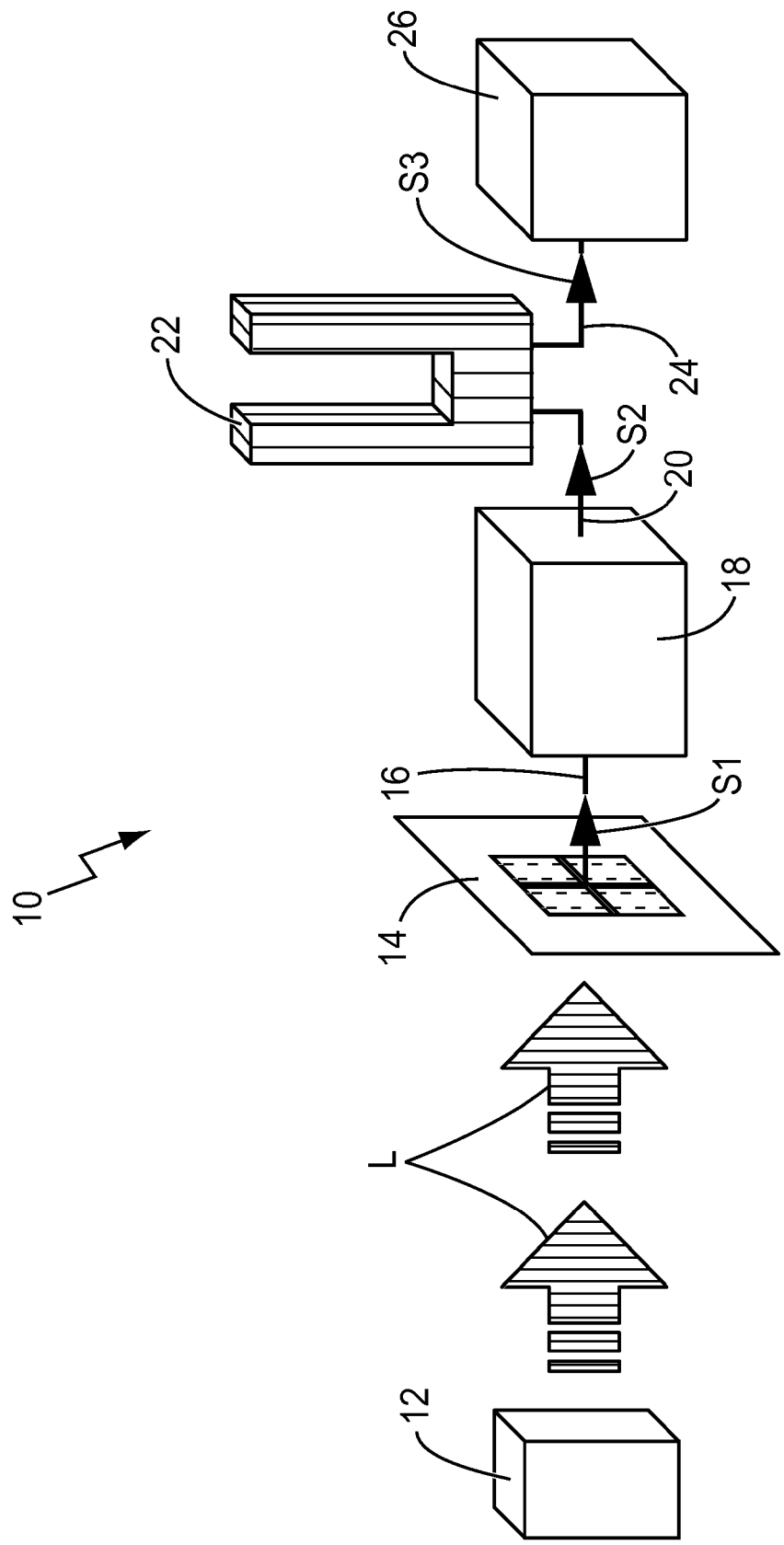
FIG. 1 is an example of an enhanced sensitivity photo detecting device.

With reference first to FIG. 1, a first example of an enhanced sensitivity photo detecting device 10 is illustrated. A light source 12, such as a laser or a light emitting diode (LED) for example, emits a light pulse (L) through space as an electromagnetic wave of one or more photons. The wavelength of the light pulse (L) may be in the visible or invisible electromagnetic spectrum.

The light pulse (L) is received and sensed by a photo detecting device 14 such as a photoresistor, a photovoltaic, or a photodiode for example. It is important to choose a photo detecting device 14 with a sufficient response time to capture the speed and intensity of the light pulse (L) to be detected.

The output from the photo detecting device 14 is a voltage or current signal that increases with the increased intensity of the received electromagnetic radiation of the light pulse (L). It is this voltage or current that may be measured, filtered and/or stored for later use. To that end, a first electronic signal (S1) is generated by the photo detecting device 14 and may be directed through a first conduit 16, such as a conductive wire or fiber optic cable, to an electronic signal conditioner 18. The electronic signal conditioner 18 may be in the form of an electronic filter, amplifier, lock-in amplifier, etc. The electronic signal conditioner 18 converts the first electronic signal (S1) of the photo detecting device 14 into a modified electronic signal (S2) for later enhancement. In some examples, an electronic signal conditioner 18 is not included.

The modified electronic signal (S2) is directed through a second conduit 20, such as a conductive wire or fiber optic cable, to a coupled electro-mechanical acoustic resonator 22. Some examples of electro-mechanical acoustic resonators 22 are quartz crystal tuning forks, quartz crystal microbalances, microcantilevers and piezoelectric actuators having a high quality factor (Q).

Quality factor (Q) is a dimensionless parameter that describes how under-damped an electro-mechanical acoustic resonator 22 is. A higher quality factor (Q) indicates a lower rate of energy loss relative to the stored energy, which means the electrical pulse oscillations die out more slowly. For best results, the quality factor (Q) of the electro-mechanical acoustic resonator 22 in the examples should be as high as possible. A quartz tuning fork comes packaged inside a vacuum-tight enclosure to reduce viscous drag on the tines for increased quality factor. A quality factor (Q) greater than or equal to approximately 50,000 is preferred, while a quality factor (Q) between approximately 50,000 and 100,000 is more preferred, and finally, a quality factor of approximately 90,000 is most preferred. In air, a reduced quality factor (Q) range of greater than, or equal to, approximately 5,000 is preferred, while a quality factor (Q) between approximately 5,000 and 16,000 is more preferred.

The electro-mechanical acoustic resonator 22 should also have a resonant frequency that is equal to, or a harmonic of the light pulses (L) being detected by the photo detecting device 14. In this way, the high quality factor (Q) of the electro-mechanical acoustic resonator 22 is energized by the modified electronic signal (S2). A damped electronic signal (S3) is, in turn, generated and output by the electro-mechanical acoustic resonator 22 and is directed through a third conduit 24 for analysis and/or further conditioning by an attached downstream device 26. For example, the downstream device 26 may be an electronic circuit, a graphic display unit, a storage device, etc. In some examples a downstream device 26 is not included.

Figure 2:
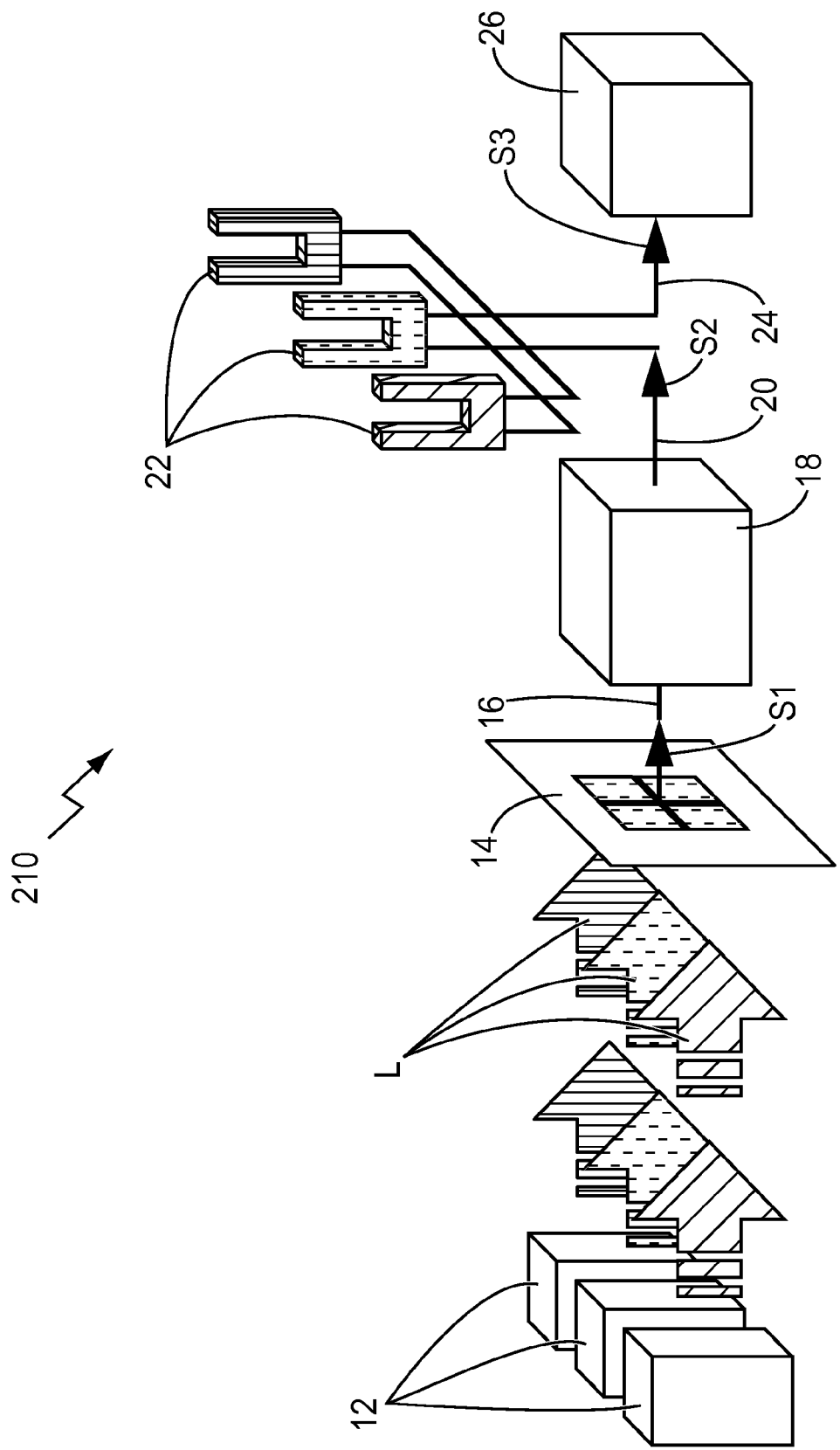
FIG. 2 is another example of an enhanced sensitivity photo detecting device.

With reference now to FIG. 2, a second example of an enhanced sensitivity photo detecting device 210 is illustrated. In this particular example, light sources 12 such as lasers or light emitting diodes (LEDs) for example, emit two or more light pulses (L) that may represent varying wavelengths of light in space. The wavelengths of the light pulses (L) may be in the visible or invisible electromagnetic spectrum.

The light pulses (L) are received by a photo detecting device 14 such as a photoresistor, a photovoltaic, or a photodiode for example. It is preferable to choose a photo detecting device 14 with a sufficient response time to capture the speed and intensity of the light pulses (L) to be detected.

The output from the photo detecting device 14 is a voltage or current that increases with the increased intensity of the received electromagnetic radiation of the light pulses (L). It is this voltage or current that can be measured, filtered and stored for later use. To that end, a first electronic signal (S1) from the photo detecting device 14 may be directed through a first conduit 16, such as a conductive wire or fiber optic cable, to an electronic signal conditioner 18. The electronic signal conditioner 18 may be in the form of an electronic filter, amplifier, lock-in amplifier, etc. The electronic signal conditioner 18 converts the first electronic signal (S1) generated by the photo detecting device 14 into a modified electronic signal (S2) for further processing. In some examples, an electronic signal conditioner 18 is not included.

The modified electronic signal (S2) is directed through a second conduit 20, such as a conductive wire or fiber optic cable, to an array of two or more electro-mechanical acoustic resonators 22. Some examples of electro-mechanical acoustic resonators 22 are quartz crystal tuning forks, quartz crystal microbalances, microcantilevers and piezoelectric actuators having high quality factors (Q) as described in the above example.

The resonant frequencies of the array of two or more electro-mechanical acoustic resonators 22 should have pulse frequencies that are equal to, or a harmonic of, the various light pulses (L) detected by the photo detecting device 14. In this way, the high quality factors (Q) of the electro-mechanical acoustic resonators 22 are energized by the modified electronic signal (S2). A damped electronic signal (S3) is generated and output by the array of electro-mechanical acoustic resonators 22 and is directed through a third conduit 24 for analysis and/or further conditioning in a downstream device 26. For example, the downstream device 26 may be an electronic circuit, a graphic display unit, a storage device, etc. In some examples a downstream device 26 is not included.

Standoff detection of residues using spectroscopic techniques generally requires photo detectors of very high sensitivity. By combining an electro-mechanical acoustic resonator 22 with a photo detecting device 14, increased photo detector standoff distances and improved signal to noise ratio (SNR) will result. Signal to noise ratio (SNR) is defined as the ratio of signal power to the noise power corrupting the signal. Noise may be caused by interference or statistical fluctuations in the signal itself. A signal to noise ratio (SNR) above 1:1 indicates more signal than noise and is preferable to a signal to noise ratio (SNR) below 1:1.

The present disclosure provides an economic solution to enhancing commercially available photo detectors that would otherwise be too unresponsive to use. Likewise, detectors of already high sensitivity may be enhanced further to gain further detection distance.

Figure 3:
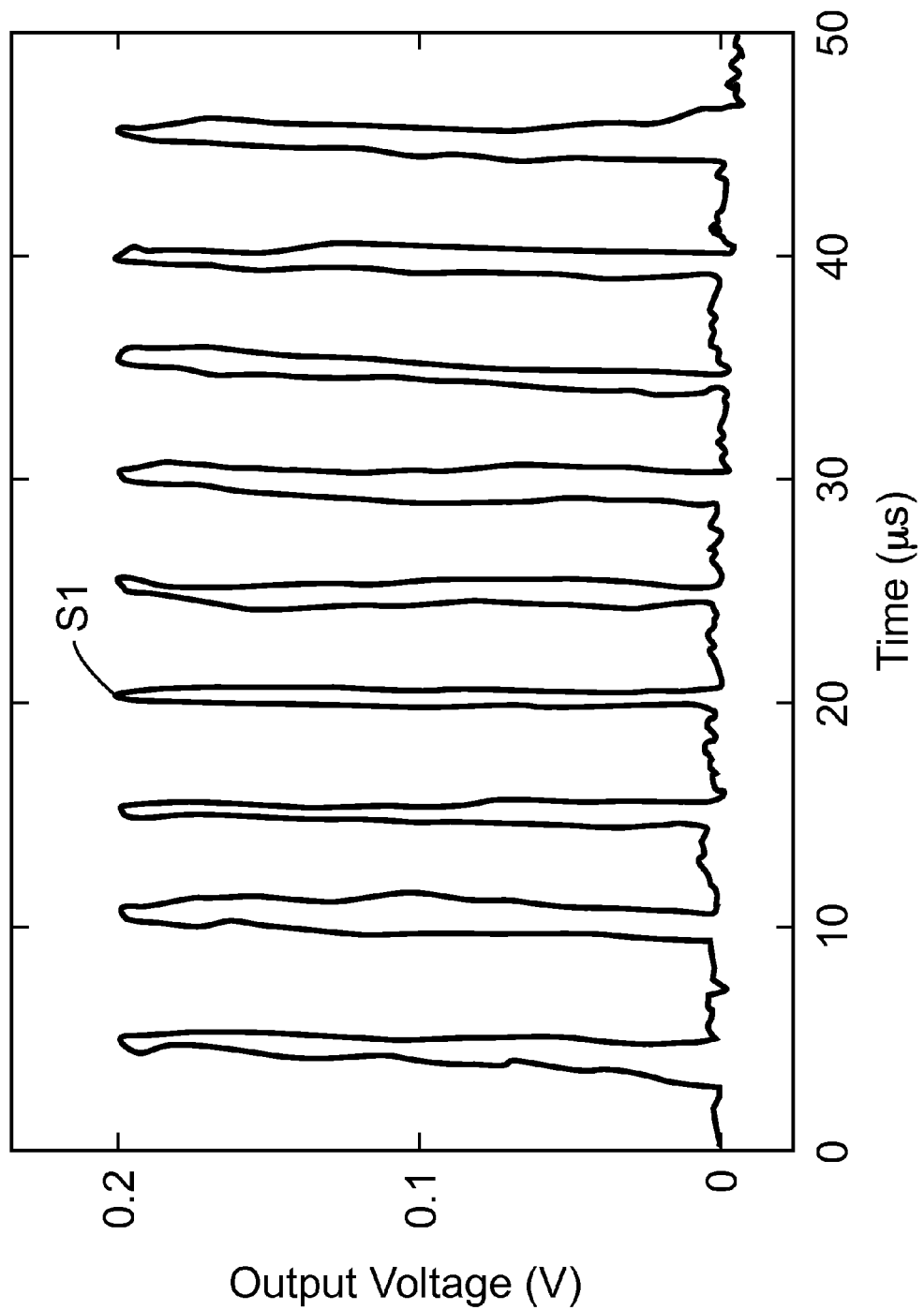
FIG. 3 is a graph illustrating an electronic signal output from a photo detecting device without enhancement.
Figure 4:
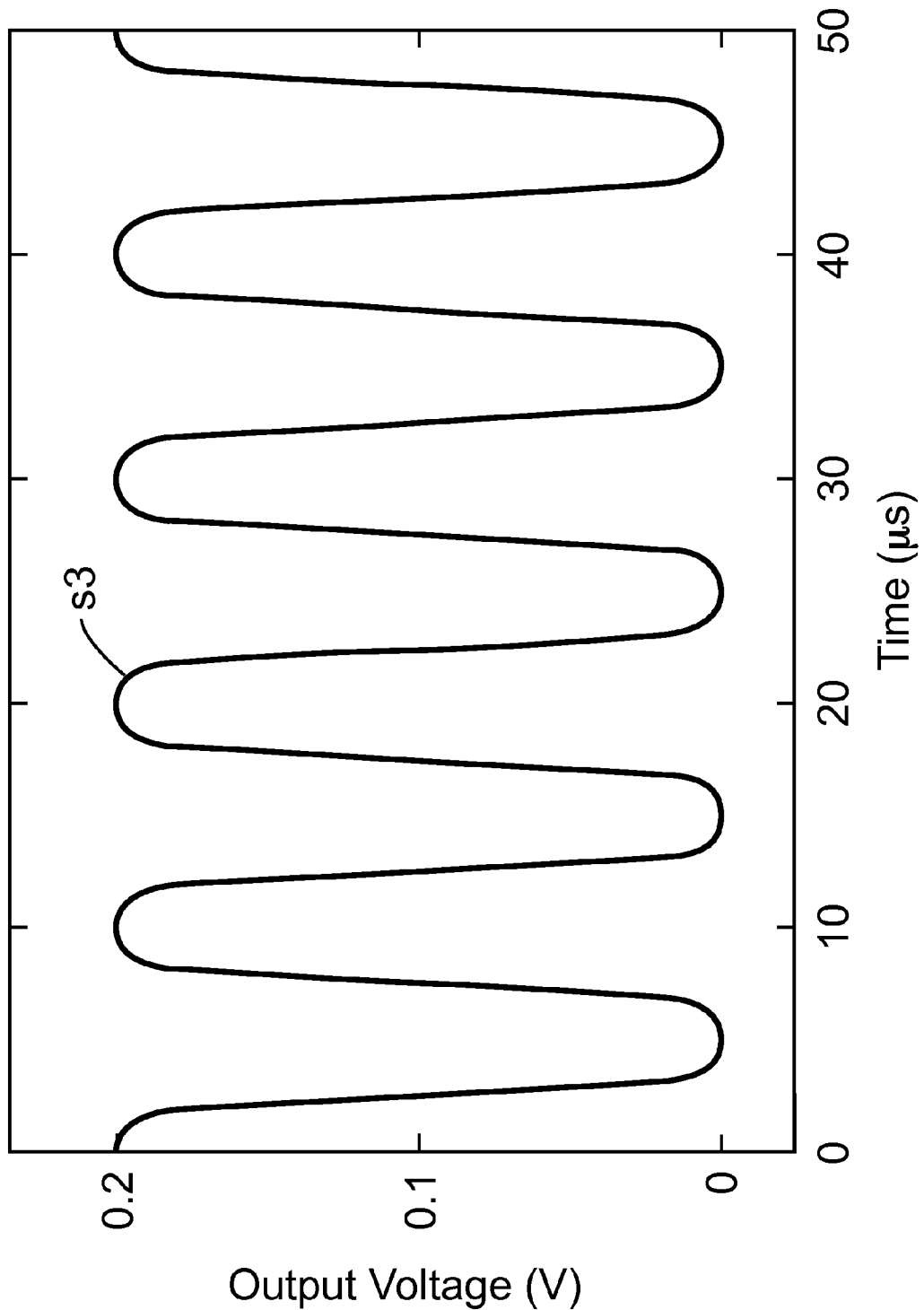
FIG. 4 is a graph illustrating the electronic signal output of FIG. 3 after enhancement with a coupled electro-mechanical acoustic resonator.

With reference now to FIG. 3, an example of a first electronic signal (S1) as it is generated and output directly from a photo detector 14 is illustrated. After the electronic signal is damped with an electro-mechanical acoustic resonator 22, a damped electronic signal (S3) is output as shown in FIG. 4.

Figure 5:
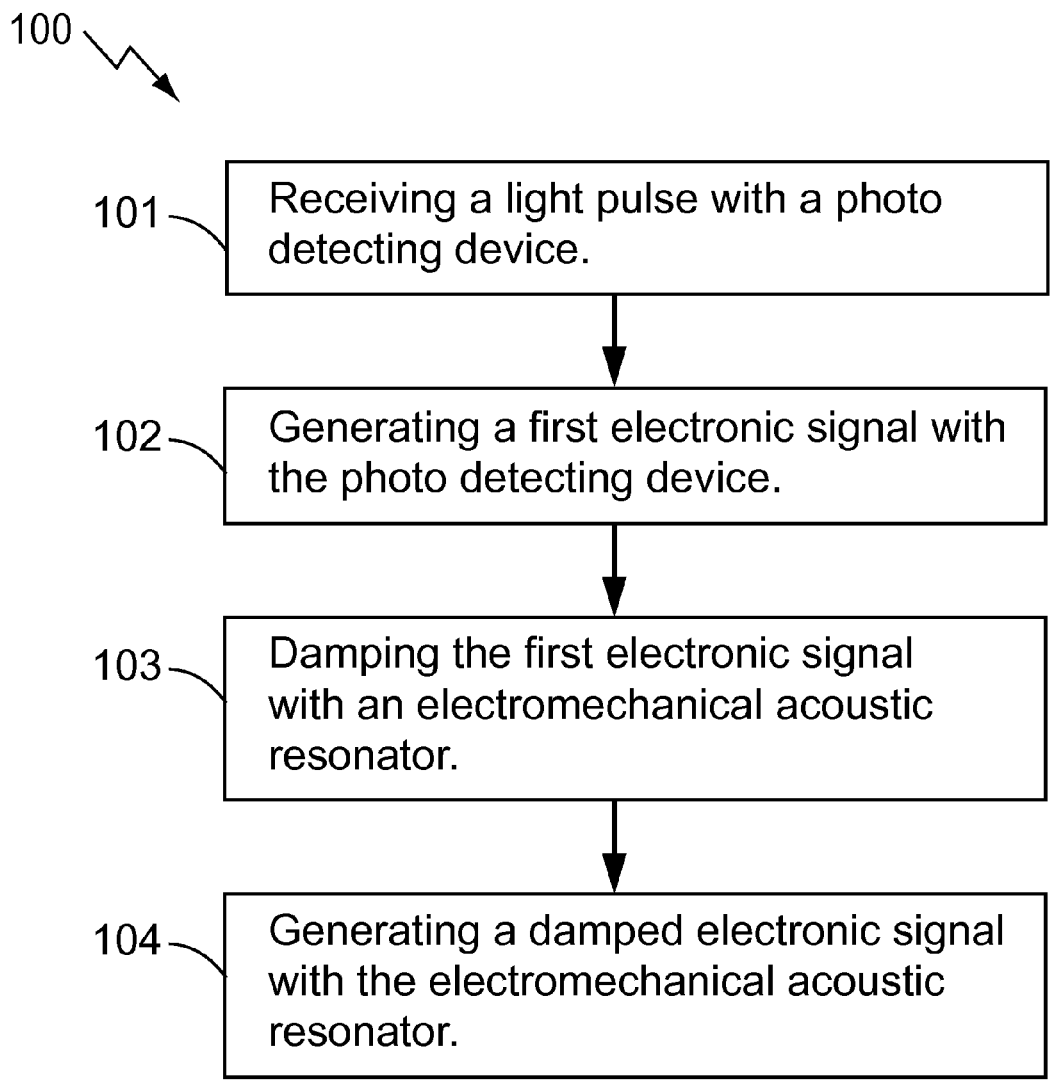
FIG. 5 is a flow diagram illustrating a series of exemplary method steps for enhancing the sensitivity of a photo detecting device.

A method 100 for enhancing the sensitivity of a photo detector 14 will now be discussed with reference to FIG. 5. In the first step labeled 101, a light pulse (L) having a pulse rate is received with the photo detector 14. In the second step labeled 102, the photo detector generates a first electronic signal in response to the received light pulse. In the third step labeled 103, the first electronic signal S1 is damped with an electro-mechanical acoustic resonator 22. In the forth step labeled 104, a damped electronic signal S3 is generated by the electro-mechanical acoustic resonator 22. The damped electronic signal S3 has a signal to noise ratio (SNR) that is greater than the signal to noise ratio (SNR) of the first electronic signal S1.

While this disclosure illustrates and enables specific examples in the field of photo detection, other fields may also benefit. Accordingly, the invention is intended to embrace those alternatives, modifications, equivalents, and variations as fall within the broad scope of the appended claims. The technology disclosed and claimed is available for licensing in specific fields of use by the assignee of record.

What is claimed is:

1. In a photo detecting device that produces a first electronic signal in response to a received light pulse, the improvement comprising:
an electro-mechanical acoustic resonator coupled to the photo detecting device for receiving the first electronic signal and producing a damped electronic signal; and
wherein the damped electronic signal has a signal to noise ratio (SNR) that is greater than the signal to noise ratio (SNR) of the first electronic signal.

2. The improvement as recited in claim 1, wherein said electro-mechanical acoustic resonator has a quality factor (Q) that is equal to, or greater than, approximately 5,000 in air.

3. The improvement as recited in claim 1, wherein said electro-mechanical acoustic resonator has a quality factor (Q) that is equal to, or greater than, approximately 50,000 in a vacuum.

4. The improvement as recited in claim 3, wherein said electro-mechanical acoustic resonator has a quality factor (Q) that is between approximately 50,000 and 100,000.

5. The improvement as recited in claim 1, wherein said electro-mechanical acoustic resonator is selected from the group consisting of a quartz crystal tuning fork, a piezoelectric actuator, a microcantilever and a crystal micro balance.

6. The improvement as recited in claim 1, wherein said electro-mechanical acoustic resonator has a resonant frequency that is equal to the frequency of the received light pulse.

7. The improvement as recited in claim 1, wherein said electro-mechanical acoustic resonator has a resonant frequency that is a harmonic of the frequency of the received light pulse.

8. The improvement as recited in claim 1, wherein said electro-mechanical acoustic resonator comprises an array of two or more electro-mechanical acoustic resonators.

9. The improvement as recited in claim 8, wherein the photo detecting apparatus produces a first electronic signal in response to multiple light pulses, and each of said electro-mechanical acoustic resonators in said array of electro-mechanical acoustic resonators has a resonant frequency corresponding to a single pulse rate in the multiple light pulses.

10. The improvement as recited in claim 1, further comprising an electronic conditioner for modifying the first electronic signal prior to the first electronic signal being received by said electro-mechanical acoustic resonator.

11. A method for enhancing the sensitivity of a photo detecting device comprising the steps of:
A) receiving a light pulse having a pulse rate with the photo detecting device;
B) generating a first electronic signal with the photo detecting device in response to the received light pulse;
C) damping the first electronic signal with an electro-mechanical acoustic resonator that is electronically coupled to the photo detecting device; and
D) generating a damped electronic signal with the electro-mechanical acoustic resonator, wherein the damped electronic signal has a signal to noise ratio (SNR) that is greater than the signal to noise ratio (SNR) of the first electronic signal.

12. The method as recited in claim 11, wherein said electro-mechanical acoustic resonator in step C) has a quality factor (Q) that is greater than, or equal to, 50,000.

13. The method as recited in claim 12, wherein said electro-mechanical acoustic resonator in step C) has a quality factor (Q) that is between 50,000 and 100,000.

14. The method as recited in claim 13, wherein said electro-mechanical acoustic resonator in step C) has a quality factor (Q) that is approximately 90,000.

15. The method as recited in claim 11, wherein said electro-mechanical acoustic resonator in step C) is selected from the group consisting of a quartz crystal tuning fork, a piezoelectric actuator, a microcantilever and a crystal micro balance.

16. The method as recited in claim 11, wherein said electro-mechanical acoustic resonator in step C) has a resonant frequency that is equal to the frequency of the received light pulse.

17. The method as recited in claim 11, wherein said electro-mechanical acoustic resonator in step C) has a resonant frequency that is a harmonic of the frequency of the received light pulse.

18. The method as recited in claim 11, wherein said electro-mechanical acoustic resonator in step C) comprises an array of two or more electro-mechanical acoustic resonators.

19. The method as recited in claim 18, wherein the photo detecting apparatus produces a first electronic signal in response to multiple, optical light pulses, and each of said electro-mechanical acoustic resonators in said array of electro-mechanical acoustic resonators has a resonant frequency corresponding to a single pulse rate in the multiple, optical light pulses.

20. The method as recited in claim 11, further comprising the step of modifying the first electronic signal with an electronic conditioner prior to the first electronic signal being damped by said electro-mechanical acoustic resonator in step C).

* * * * *